(12) United States Patent
Kimura

(10) Patent No.: US 9,601,177 B2
(45) Date of Patent: Mar. 21, 2017

(54) DATA RETENTION CONTROL CIRCUIT, DATA WRITING METHOD, DATA READING METHOD, METHOD OF TESTING CHARACTERISTICS OF FERROELECTRIC STORAGE DEVICE, AND SEMICONDUCTOR CHIP

(71) Applicant: Rohm Co., Ltd., Kyoto (JP)

(72) Inventor: Hiromitsu Kimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/847,331

(22) Filed: Sep. 8, 2015

(65) Prior Publication Data
US 2016/0071569 A1   Mar. 10, 2016

(30) Foreign Application Priority Data
Sep. 10, 2014   (JP) .................. 2014-184267

(51) Int. Cl.
  *G11C 11/22* (2006.01)
  *G11C 29/14* (2006.01)
  *G11C 29/50* (2006.01)

(52) U.S. Cl.
  CPC ...... *G11C 11/2273* (2013.01); *G11C 11/2275* (2013.01); *G11C 29/14* (2013.01); *G11C 29/50016* (2013.01)

(58) Field of Classification Search
  USPC ......................................... 365/145
  See application file for complete search history.

(56) References Cited

U.S. PATENT DOCUMENTS

2006/0273837 A1* 12/2006 Shimazaki ....... G01R 31/31857
                                                         327/202
2013/0285711 A1* 10/2013 Miyake ................. H03K 3/012
                                                         327/109

FOREIGN PATENT DOCUMENTS

JP        2013-134723       7/2013

* cited by examiner

*Primary Examiner* — Anthan Tran
(74) *Attorney, Agent, or Firm* — Fish & Richardson P.C.

(57) ABSTRACT

A data retention control circuit includes a data retention part having first and second logic circuits, a ferroelectric storage part having first and second ferroelectric device parts, first and second transmission control parts, and a test voltage supply control part. The first transmission control part has first and second transmission control circuits controlling first and second logic signals to the first and second ferroelectric device parts, respectively. The second transmission control part has third and fourth transmission control circuits controlling transmission of first and second storage data from the first and second ferroelectric device part to the second and first logic circuits, respectively. The test voltage supply control part has first and second test voltage supply control circuits controlling supplies of first and second test voltages to the second and first logic circuit, respectively.

14 Claims, 5 Drawing Sheets

US 9,601,177 B2

DATA RETENTION CONTROL CIRCUIT, DATA WRITING METHOD, DATA READING METHOD, METHOD OF TESTING CHARACTERISTICS OF FERROELECTRIC STORAGE DEVICE, AND SEMICONDUCTOR CHIP

CROSS-REFERENCE TO RELATED APPLICATIONS

This application is based upon and claims the benefit of priority from Japanese Patent Application No. 2014-184267, filed on Sep. 10, 2014, the entire contents of which are incorporated herein by reference.

TECHNICAL FIELD

The present disclosure relates to a data retention control circuit using a ferroelectric device, a data writing method using the data retention control circuit, a data reading method, a method of testing characteristics of a ferroelectric storage device, and a semiconductor chip.

BACKGROUND

As a means for restoring data retained in a register such as a flip-flop after the power cutoff, for example, a data retention control circuit may use a ferroelectric device.

FIG. 5 is a view schematically illustrating a conventional data retention control circuit 30. The data retention control circuit 30 includes a controller 13a and a data retention circuit 13b.

The controller 13a transmits a control signal SDS11, a control signal SKS11, a control signal SKS12, a control signal SK11, and a control signal SK12 to the data retention circuit 13b.

The data retention circuit 13b includes a data retention part M11, a transmission control part DS11, a ferroelectric storage part K11, a ferroelectric control part KS11, and a sense amplifier SA11.

The data retention part M11 includes a transistor Nc11, a logic circuit NAND11, and a logic circuit NAND12.

The transistor Nc11 transmits a data signal Din11 input from an input terminal DTin11 to the logic circuit NAND11, for example, at a rising timing of a clock signal CLK11 which is output from the controller 13a and input through an input terminal Tc1k11 to a gate terminal G.

The logic circuit NAND11 inverts a logic level of the data signal Din11 into a logic signal Nout11 to be output. The logic circuit NAND12 inverts the output signal Nout11 into a logic signal Nout12 to be output.

The data retention part M11 circulates the output logic signals Nout11 and Nout12 between the logic circuit NAND11 and the logic signal NAND12 to retain a logic level based on the data signal Din11, and an inverter INV11 inverts the logic signal Nout11 to output an output signal Dout11 through an output terminal DTout11.

The transmission control part DS11 includes a logic circuit NOR11 and a logic circuit NOR12. Transmission of the logic signal Nout11 by the logic circuit NOR11 and transmission of the logic signal Nout12 by the logic circuit NOR12 are controlled by the control signal SDS11, which is output from the controller 13a.

The ferroelectric storage part K11 includes a ferroelectric device C11 and a ferroelectric device C12.

The ferroelectric device C11 has an anode terminal, which is connected to the controller 13a, and a cathode terminal, which is connected to an output terminal of the logic circuit NOR11. The ferroelectric device C11 retains a logic level of the logic signal Nout11 as storage data KD11. Here, a connection point between the cathode terminal of the ferroelectric device C11 and the logic circuit NOR11 will be referred to as Nd11.

The ferroelectric device C12 has an anode terminal, which is connected to the controller 13a, and a cathode terminal, which is connected to an output terminal of the logic circuit NOR12. The ferroelectric device C12 retains a logic level of the logic signal Nout12 as storage data KD12. Here, a connection point between the cathode terminal of the ferroelectric device C12 and the logic circuit NOR12 will be referred to as Nd12.

The ferroelectric control part KS11 includes a transistor N11 and a transistor N12.

The transistor N11 has a gate terminal G connected to the controller 13a to receive the control signal SKS11, and a drain terminal D connected to a node Nd13. The node Nd13 is closer to the output terminal of the logic circuit NOR11 than the node Nd11 is, which is the connection point between the logic circuit NOR11 and the cathode terminal of the ferroelectric device C11. The transistor N11 further has a source terminal S connected to the controller 13a and the anode terminal of the ferroelectric device C11. The transistor N11 is turned on and off by the control signal SKS11 to thereby control whether to short both ends of the ferroelectric device C11.

The transistor N12 has a gate terminal G connected to the controller 13a to receive the control signal SKS12, and a drain terminal D connected to a node Nd14. The node Nd14 is closer to the output terminal of the logic circuit NOR12 than the node Nd12 is, which is the connection point between the logic circuit NOR12 and one end of the ferroelectric device C12. The transistor N12 further has a source terminal S connected to the anode terminal of the ferroelectric device C12. The transistor N12 is turned on and off by the control signal SKS12 to thereby control whether to short both ends of the ferroelectric device C12.

The sense amplifier SA11 is driven by a control signal SSA11 which is output from the controller 13a. The sense amplifier SA11 has an input terminal SAin11 to which the storage data KD11 which is retained in the ferroelectric device C11 is input, and an input terminal SAin12 to which the storage data KD12 retained in the ferroelectric device C12 is input. When the control signal SSA11 has a high level, the sense amplifier SA11 compares the storage data KD11, which is input to the input terminal SAin11, and the storage data KD12, which is input to the input terminal SAin12. When the storage data KD11 has a higher level than the storage data KD12, the sense amplifier SA11 supplies an output signal SSAout11 having a high level to the logic circuit NAND12 and supplies an output signal SAout12 having a low level to the logic circuit NAND11. Further, when the storage data KD11 has a lower level than the storage data KD12 has, the sense amplifier SA11 supplies an output signal SSAout11 having a low level to the logic circuit NAND12 and supplies an output signal SAout12 having a high level to the logic circuit NAND11.

A normal operation in the data retention control circuit 30 illustrated in FIG. 5, that is, an operation of retaining the data signal Din11 in the data retention part M11 and outputting it as an output signal Dout11 is performed in a state where an electrical connection between the data retention part M11 and the ferroelectric storage part K11 is blocked by the control signal SDS11 having a low level.

Characteristics of the ferroelectric device C11 of the ferroelectric storage part K11 in the data retention control circuit 30 illustrated in FIG. 5 are tested under the condition where transmission of the logic signal Nout11 to the ferroelectric device C11 and transmission of the logic signal Nout12 to the ferroelectric device C12 are blocked by the control signal SDS11 with a low level. For example, to test characteristics of the ferroelectric device C11, when the transistor N11 is turned off by the control signal SKS11 with a low level and the transistor N12 is turned on by the control signal SKS12 with a high level, a test voltage having a predetermined voltage level is output from the controller 13a as the control signal SK12. In this case, the storage data KD11 of the ferroelectric device C11 is input to the input terminal SAin11 of the sense amplifier SA11, and the control signal SKS12 is output from the controller 13a and input to the input terminal SAin12 through the transistor N12. Based on a comparison between the control signal SKS12 and the storage data KD11, the sense amplifier SA11 outputs the output signal SSAout11 to the logic circuit NAND12 while outputting the output signal SAout12 to the logic circuit NAND11. Further, by detecting changes in the output signal Dout11 which are obtained by gradually changing a test voltage Vt11, a voltage level of the storage data KD11 stored in the ferroelectric device C11 is detected for the test of the characteristics of the ferroelectric device C11. Also, characteristics of the ferroelectric device C12 may be tested in the same manner.

In the characteristics test of the ferroelectric device C11 of the conventional data retention control circuit 30, since the control signal SK12 is input to the input terminal SAin12 via the transistor N12, a potential difference occurs between the control signal SK12, which is directly applied to the anode terminal of the ferroelectric device C12 from the controller 13a, and the control signal SKS12, which is applied to the cathode terminal of the ferroelectric device C12 via the transistor N12, due to ON resistance of the transistor N12. This causes concern that unintended data may be recorded in the ferroelectric device C12.

In the characteristics test of the ferroelectric device C12, the storage data KD12 which is unintentionally recorded in the ferroelectric device C12 affects a voltage level of the control signal SK12, which is input to the input terminal SAin12 of the sense amplifier SA11 and, causes a problem that the precision of the characteristics test of the ferroelectric device C12 is degraded. This problem may arise in regard to the ferroelectric device C11 as well.

SUMMARY

The present disclosure provides some embodiments of a data retention control circuit, a data writing method, a data reading method, a method for testing characteristics of a ferroelectric storage part, and a semiconductor chip, which are capable of testing characteristics of a ferroelectric device more precisely.

According to one embodiment of the present disclosure, a data retention control circuit may include a data retention part for retaining a logic level of a data signal to be output as an output signal, the data retention part having a first logic circuit for outputting a first logic signal based on the logic level of the data signal, and a second logic circuit for outputting a second logic signal, which is based on the first logic signal, to the first logic circuit, and a ferroelectric storage part having a first ferroelectric device part for storing as first storage data a logic level of the first logic signal, which is output from the first logic circuit, and a second ferroelectric device part for storing as second storage data a logic level of the second logic signal, which is output from the second logic circuit. The data retention control circuit may further include a first transmission control part having a first transmission control circuit for controlling transmission of the first logic signal, which is output from the first logic circuit, to the first ferroelectric device part, and a second transmission control circuit for controlling transmission of the second logic signal, which is output from the second logic circuit, to the second ferroelectric device part; a second transmission control part having a third transmission control circuit provided at a first node which is a connection point between the first ferroelectric device part and the second logic circuit, and a fourth transmission control circuit provided at a second node which is a connection point between the second ferroelectric device part and the first logic circuit. The third transmission control circuit may control transmission of the first storage data output from the first ferroelectric device part to the second logic circuit, and the fourth transmission control circuit may control transmission of the second storage data output from the second ferroelectric device part to the first logic circuit. The data retention control circuit may further include a test voltage supply control part having a first test voltage supply control circuit connected to a third node which is a connection point between the third transmission control circuit and the second logic circuit, and a second test voltage supply control circuit connected to a fourth node which is a connection point between the fourth transmission control circuit and the first logic circuit. The first test voltage supply control circuit may controls a supply of a first test voltage to the second logic circuit, and the second test voltage supply control circuit may controls a supply of a second test voltage to the first logic circuit.

According to another embodiment of the present disclosure, a data retention control circuit may include a first logic circuit for outputting a first logic signal; a second logic circuit for outputting a second logic signal, and a ferroelectric storage part having a first ferroelectric device part for storing as first storage data a logic level of the first logic signal, which is output from the first logic circuit, and a second ferroelectric device part for storing as second storage data a logic level of the second logic signal, which is output from the second logic circuit. The data retention control circuit may further includes a first transmission control part having a first transmission control circuit for controlling transmission of the first logic signal, which is output from the first logic circuit, to the first ferroelectric device part, and a second transmission control circuit for controlling transmission of the second logic signal, which is output from the second logic circuit, to the second ferroelectric device part, and a second transmission control part having a third transmission control circuit provided at a first node which is a connection point between the first ferroelectric device part and a third logic circuit, and a fourth transmission control circuit provided at a second node which is a connection point between the second ferroelectric device part and a fourth logic circuit. The third transmission control circuit may control transmission of the first storage data output from the first ferroelectric device part to the third logic circuit, and the fourth transmission control circuit may control transmission of the second storage data output from the second ferroelectric device part to the fourth logic circuit. The data retention control circuit may further includes a test voltage supply control part including a first test voltage supply control circuit connected to a third node as a connection point between the third transmission control circuit and the third logic circuit, and a second test voltage supply control circuit connected to a fourth node as a connection point between the fourth transmission control circuit and the fourth logic circuit. The first test voltage supply control circuit may control a supply of a first test voltage to the third logic circuit, and the second test voltage supply control circuit may control the supply of a second test voltage to the fourth logic circuit.

According to still another embodiment of the present disclosure, there is provided a data writing method of storing the logic level of the data signal in the ferroelectric storage part of the data retention control circuit according to one embodiment of the present disclosure.

According to still another embodiment of the present disclosure, there is provided a data reading method of reading the first storage data and the second storage data from the ferroelectric storage part of the data retention control circuit according to one embodiment of the present disclosure.

According to still another embodiment of the present disclosure, there is provided a method of testing characteristics of the ferroelectric storage part of the data retention control circuit according to one embodiment of the present disclosure.

According to still another embodiment of the present disclosure, there is provided a semiconductor chip, including: the data retention control circuit according to one embodiment of the present disclosure; a first electrode pad electrically connected to the input terminal of the first logic circuit, and configured to receive the data signal from the outside; and a second electrode pad configured to receive the source voltage supplied from the power source.

DETAILED DESCRIPTION

Hereinafter, embodiments of the present disclosure will be described with reference to the drawings. Further, the numbers, circuits, and the likes described below may be appropriately selected without departing from the spirit of the present disclosure.

First Embodiment

Figure 1:
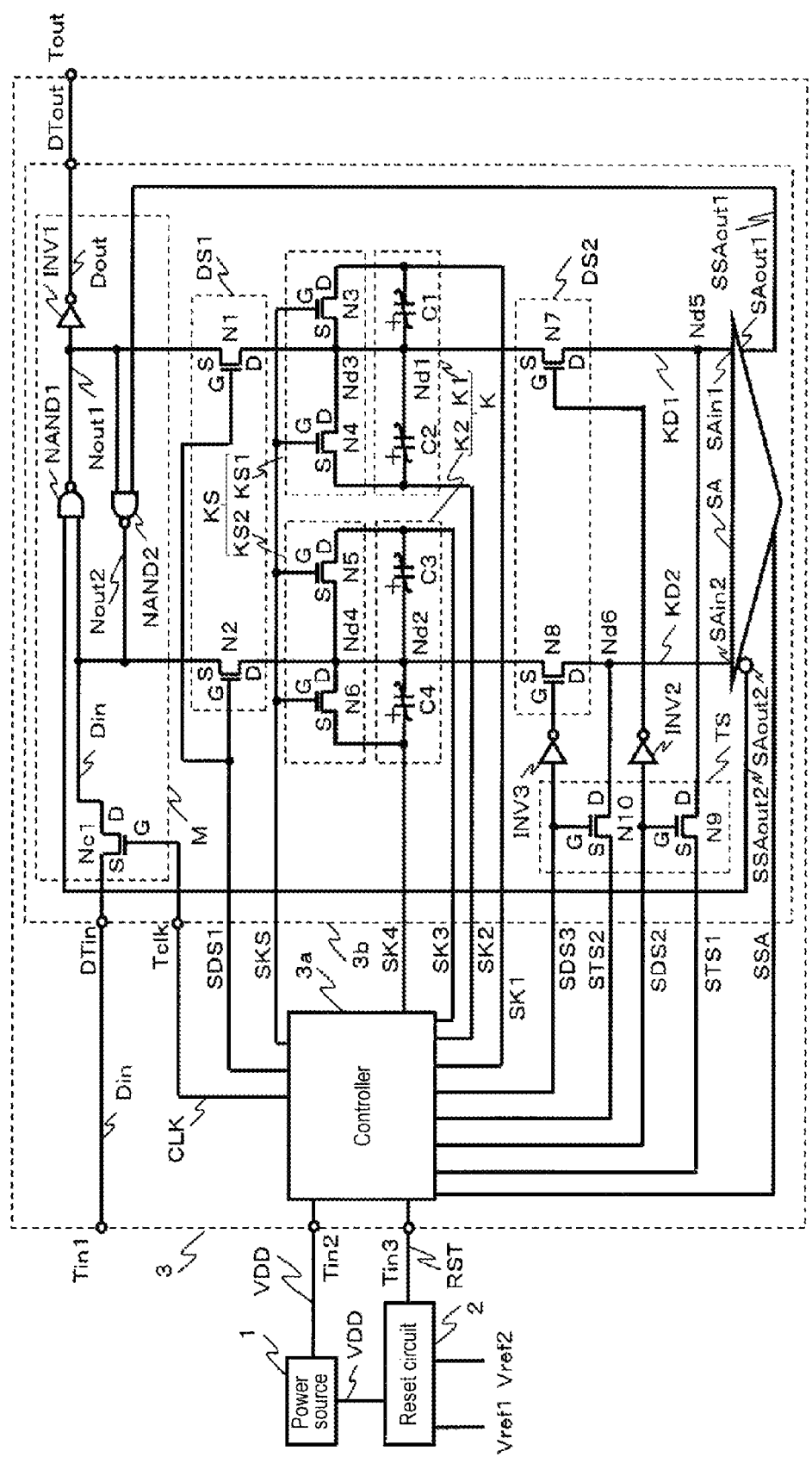
FIG. 1 illustrates an electronic device 10 according to a first embodiment of the present disclosure.

FIG. 1 illustrates the electronic device 10 according to the first embodiment of the present disclosure. The electronic device 10 may include a power source 1, a reset circuit 2, and a data retention control circuit 3.

The power source 1 may supply a source voltage VDD to the reset circuit 2 and the data retention control circuit 3. A rated voltage of the source voltage VDD may be, for example, 10 V.

The reset circuit 2 may be connected to the power source 1 and monitor a voltage level of the source voltage VDD supplied from the power source 1. The rest circuit 2 may output a reset signal RST based on the monitoring result. When detecting that the source voltage VDD is lower than a first reference voltage Vref1 of, for example, 8V, the reset circuit 2 may output a reset signal RST with a low level as a first reset signal. When detecting that the source voltage VDD is higher than a second reference voltage Vref2 of, for example, 2V, the reset circuit 2 may output a reset signal RST with a high level as a second reset signal.

The data retention control circuit 3 may include a controller 3a and a data retention circuit 3b, and may be embedded in a semiconductor chip. In addition, the data retention control circuit 3 may include an input terminal Tin1 to which a data signal Din from the outside may be input, an input terminal Tin2 to which the source voltage VDD may be supplied from the power source 1, an input terminal Tin3 to which the reset signal RST may be input from the reset circuit 2, and an output terminal Tout. Further, the input terminal Tin1, the input terminal Tin2, the input terminal Tin3, and the output terminal Tout may be connected to a first electrode pad, a second electrode pad, a third electrode pad, and a fourth electrode pad disposed in the semiconductor chip, respectively.

The controller 3a may be driven by the source voltage VDD. To perform various controlling, the controller 3a may output to data retention circuit 3b a clock signal CLK, a control signal SDS1 as a first transmission control signal, a control signal SKS, a control signal SK1 and a control signal SK2 as first storage control signals, a control signal SK3 and a control signal SK4 as second storage control signals, a control signal SDS2 as a second transmission control signal, a control signal SDS3 as a third transmission control signal, a control signal STS1 as a first test voltage, a control signal STS2 as a second test voltage, and a control signal SSA. Further, characteristics of each of the control signals will be described below.

The data retention circuit 3b may include a data retention part M, a ferroelectric storage part K, a transmission control part DS1 as a first transmission control part, a storage control part KS, a transmission control part DS2 as a second transmission control part, a test voltage supply control part TS, and a sense amplifier SA. In addition, the data retention circuit 3b may include, as terminals for electrical connections with the outside, an input terminal DTin connected to the input terminal Tin1, an input terminal Tclk connected to the controller 3a, to which a clock signal CLK is input, and an output terminal Dout connected to the output terminal Tout.

The data retention part M may include a transistor Nc1, a logic circuit NAND1, a logic circuit NAND2, and an inverter INV1.

The transistor Nc1 may have a source terminal S connected to the input terminal Din, and a gate terminal G connected to the input terminal Tclk. With the clock signal CLK which is input to the gate terminal G from the input terminal Tclk, the transistor Nc1 may perform controlling transmission of the data signal Din, which may be input through the input terminal Tin1 from the outside, and then input to the source terminal S via the input terminal DTin.

The logic circuit NAND1 may have a first input terminal connected to the drain terminal D of the transistor Nc1. The logic circuit NAND1 may invert a logic level of the data signal Din which may input to the first input terminal to output a logic signal Nout1 as a first logic signal from an output terminal.

The logic circuit NAND2 may have a first input terminal connected to the output terminal of the logic circuit NAND1.

The logic circuit NAND2 may invert a logic level of the logic signal Nout1 which may input from the first input terminal to output a logic signal Nout2 as a second logic signal from an output terminal. Further, the output terminal of the logic circuit NAND2 is connected to the first input terminal of the logic circuit NAND1 and the logic signal Nout2 is input to the first input terminal of the logic circuit NAND1.

The data retention part M structured as described above may retain the logic level of the data signal Din by repeating operations of inputting the logic signal Nout1, which is output from the logic circuit NAND1, to the first input terminal of the logic circuit NAND2 and inputting the logic signal Nout2, which is output from the logic circuit NAND2, to the first input terminal of the logic circuit NAND1.

The data retention part M may further include an inverter INV1 for inverting the logic signal Nout1, which is output from the logic circuit NAND1 to output an output signal Dout. By doing so, the data retention part M, and further, the data retention circuit 3b may retain the logic level of the data signal Din, which is input from the outside, and outputs the output signal Dout.

The transmission control part DS1 may include a transistor N1 as a first transmission control circuit for controlling transmission of the logic signal Nout1, which is output from the logic circuit NAND1, to the ferroelectric storage part K; and a transistor N2 as a second transmission control signal for controlling transmission of the logic signal Nout2, which is output from the logic circuit NAND2, to the ferroelectric storage part K.

The transistor N1 may be an NMOS transistor of which one end is a source terminal S which may be connected to the output terminal of the logic circuit NAND1 to receive the logic signal Nout1. The transistor N1 further include a gate terminal G as a control terminal which may be connected to the controller 3a so that ON/OFF of the transistor N1 is controlled by the control signal SDS1 which is input to the gate terminal G from the controller 3a. When the control signal SDS1 having the high level at, for example, 1.5 V, is input to the gate terminal G, the transistor N1 may be turned on to output the logic signal Nout1, which is output from the logic circuit NAND1, through the drain terminal D and to transmit the logic signal Nout1 to the ferroelectric storage part K, which is at a next stage. Further, when the control signal SDS1 having a low level at, for example, 0 V, is input to the gate terminal G, the transistor N1 may be turned off and control to stop the transmission of the logic signal Nout1 to the ferroelectric storage part K, which is at the next stage. Hereinafter, the low level of a signal refers to, for example, 0 V.

The transistor N2 may be an NMOS transistor of which one end is a source terminal S which may be connected to the output terminal of the logic circuit NAND2 to receive the logic signal Nout2. The transistor N2 further has a gate terminal G as a control terminal which may be connected to the controller 3a so that ON/OFF of the transistor N2 may be controlled by the control signal SDS1 which is input to the gate terminal G from the controller 3a. When the control signal SDS1 having the high level at, for example, 1.5 V, is input to the gate terminal G, the transistor N2 may be turned on to output the logic signal Nout2, which may be output from the logic circuit NAND2, through the drain terminal D and to transmit the logic signal Nout2 to the ferroelectric storage part K, which is at a next stage. When the control signal SDS1 having the low level is input to the gate terminal G, the transistor N2 may be turned off and stop transmission of the logic signal Nout2 to the ferroelectric storage part K, which is at the next stage.

The ferroelectric storage part K may have a ferroelectric device part K1 as a first ferroelectric device part, which includes a ferroelectric device C1 and a ferroelectric device C2. The ferroelectric device part K1 may retain and output the logic level of the logic signal Nout1, which may be output from the logic circuit NAND1, as storage data KD1, which is first storage data. The ferroelectric storage part K may further have a ferroelectric device part K2 as a second ferroelectric device part, which may include a ferroelectric device C3 and a ferroelectric device C4. The ferroelectric device part K2 may retain and output the logic level of the logic signal Nout2 which is output from the logic circuit NAND2, as storage data KD2, which is a second storage data.

The ferroelectric device C1 may have an anode terminal connected to the drain terminal D, which is the other end of the transistor N1, to receive the logic signal Nout1, which is output from the logic circuit NAND1, by the control of the transistor N1. The ferroelectric device C1 may further have a cathode terminal connected to the controller 3a to receive the control signal SK1. The control signal SK1 may be a logic signal having a high level at, for example, 1.5 V, or the low level. A connection point between the anode terminal of the ferroelectric device C1 and the drain terminal D of the transistor N1 will be referred to as a node Nd1.

When the logic signal Nout1 is applied to the anode terminal of the ferroelectric device C1 and the control signal SK1 having a logic level different from that of the logic signal Nout1 is applied to the cathode terminal thereof, a residual polarization state of the ferroelectric device C1 may transit between a reverse state and a non-reverse state, thereby storing data based on the logic signal Nout1.

The ferroelectric device C2 may have a cathode terminal, which may be connected to the drain terminal D of the transistor N1 via the node Nd1 to receive the logic signal Nout1, which is output from the logic circuit NAND1, under the control of the transistor N1. The ferroelectric device C2 may further have an anode terminal, which is connected to the controller 3a to receive the control signal SK2. The control signal SK2 may be a logic signal having a high level at, for example, 1.5 V, or the low level.

When the logic signal Nout1 is applied to the cathode terminal of the ferroelectric device C2 and the control signal SK2 having a logic level different from that of the logic signal Nout1 is applied to the anode terminal thereof, a residual polarization state of the ferroelectric device C2 may transit between a reverse state and a non-reverse state, thereby storing data based on the logic signal Nout1.

Here, the anode terminal of the ferroelectric device C1 and the cathode terminal of the ferroelectric device C2, which are one end of the ferroelectric device part K1, may be connected at the node Nd1. Thus, a logic level of the storage data KD1, which is stored in and output from the ferroelectric device part K1, may be determined by a relationship between the data stored in the ferroelectric device C1 and the data stored in the ferroelectric device C2. In the data retention circuit 3b according to the present embodiment, when a capacitance value of the ferroelectric device C2 is greater than that of the ferroelectric device C1, the storage data KD1 may have the low level, and when the capacitance value of the ferroelectric device C2 is smaller than that of the ferroelectric device C1, the storage data KD1 may have the high level. Also, the cathode terminal of the ferroelectric device C1 and the anode terminal of the ferroelectric device C2 will be referred to as the other ends of the ferroelectric device part K1.

Further, transmission of the logic signal Nout1 from the logic circuit NAND1 to the ferroelectric device part K1 may be controlled by the transistor N1.

The ferroelectric device C3 may have an anode terminal connected to the drain terminal D, which is the other end of the transistor N2. The logic signal Nout2 from the logic circuit NAND2 may input to the anode terminal of the ferroelectric device C3 under the control of the transistor N2. Further, the ferroelectric device C3 may further have a cathode terminal connected to the controller 3a to receive the control signal SK3. The control signal SK3 may be a logic signal having a high level at, for example, 1.5 V, or the low level. Here, a connection point between the anode terminal of the ferroelectric device C3 and the drain terminal D of the transistor N2 will be referred to as a node Nd2.

When the logic signal Nout2 is applied to the anode terminal of the ferroelectric device C3 and the control signal SK3 having a logic level different from that of the logic signal Nout2 is applied to the cathode terminal thereof, a residual polarization state of the ferroelectric device C3 may transit between a reverse state and a non-reverse state, thereby storing data based on the logic signal Nout2.

The ferroelectric device C4 may have a cathode terminal which is connected to the drain terminal D of the transistor N2 via the node Nd2, and the logic signal Nout2 from the logic circuit NAND2 may be input thereto under the control of the transistor N2. Further, an anode terminal of the ferroelectric device C4 may be connected to the controller 3a to receive the control signal SK4. The control signal SK4 may be a logic signal having a high level at, for example, 1.5 V, or the low level.

When the logic signal Nout2 is applied to the cathode terminal of the ferroelectric device C4 and the control signal SK4 having a logic level different from that of the logic signal Nout2 is applied to the anode terminal thereof, a residual polarization state of the ferroelectric device C4 transits between a reverse state and a non-inverting state, and thus, thereby storing data based on the logic signal Nout2.

Here, the anode terminal of the ferroelectric device C3 and the cathode terminal of the ferroelectric device C4 may be connected at the node Nd2. Thus, a logic level of the storage data KD2 that is stored in and output from the ferroelectric device part K2 is determined by a relationship between the data stored in the ferroelectric device C3 and the data stored in the ferroelectric device C4. In the data retention circuit 3b according to the present embodiment, when a capacitance value of the ferroelectric device C4 is greater than that of the ferroelectric device C3, the storage data KD2 has the low level, and when the capacitance value of the ferroelectric device C4 is smaller than that of the ferroelectric device C3, the storage data KD2 has a high level. Also, the cathode terminal of the ferroelectric device C3 and the anode terminal of the ferroelectric device C4 will be referred to as the other ends of the ferroelectric device part K2.

Further, transmission of the logic signal Nout2 from the logic circuit NAND2 to the ferroelectric device part K2 may be controlled by the transistor N2.

The storage control part KS may include a storage control part KS1 having a transistor N3 and a transistor N4, and a storage control part KS2 having a transistor N5 and a transistor N6.

The transistor N3 may be an NMOS transistor. A source terminal S of the transistor N3 may be connected to the node Nd3, which is a connection point between the drain terminal of the transistor N1 and the node Nd1. A drain terminal D of the transistor N3 may be connected to the cathode terminal of the ferroelectric device C1. A gate terminal G of the transistor N3 may be connected to the controller 3a to receive the control signal SKS. When the control signal SKS having a high level at, for example, 1.5 V, is supplied from the controller 3a to the transistor N3, the transistor N3 is turned on and the anode terminal and the cathode terminal of the ferroelectric device C1 are shorted, thereby preventing a generation of a potential difference between the anode terminal and the cathode terminal of the ferroelectric device C1, and further, preventing unintended data from being written into the ferroelectric device C1.

The transistor N4 may be an NMOS transistor. A source terminal S of the transistor N4 may be connected to the anode terminal of the ferroelectric device C2. A drain terminal D of the transistor N4 may be connected to the node Nd3. A gate terminal G of the transistor N4 may be connected to the controller 3a to receive the control signal SKS. When the control signal SKS having a high level at, for example, 1.5 V, is supplied from the controller 3a to the transistor N4, the transistor N4 is turned on and the anode terminal and the cathode terminal of the ferroelectric device C2 are shorted, thereby preventing a generation of a potential difference between the anode terminal and the cathode terminal of the ferroelectric device C2, and further, preventing any unexpected data from being written into the ferroelectric device C2.

The transistor N5 may be an NMOS transistor. A source terminal S of the transistor N5 may be connected to the node Nd4, which is a connection point between the drain terminal of the transistor N2 and the node Nd2. A drain terminal D of the transistor N5 may be connected to the cathode terminal of the ferroelectric device C3. A gate terminal G of the transistor N5 may be connected to the controller 3a to receive the control signal SKS. When the control signal SKS having a high level at, for example, 1.5 V, is supplied from the controller 3a to the transistor N5, the transistor N5 is turned on and the anode terminal and the cathode terminal of the ferroelectric device C3 are shorted, thereby preventing a generation of a potential difference between the anode terminal and the cathode terminal of the ferroelectric device C3, and further, preventing any unexpected data from being written into the ferroelectric device C3.

The transistor N6 may be an NMOS transistor. A source terminal S of the transistor N6 may be connected to the anode terminal of the ferroelectric device C4. A drain terminal D of the transistor N6 may be connected to the node Nd4. A gate terminal G of the transistor N6 is connected to the controller 3a to receive the control signal SKS. When the control signal SKS having a high level at, for example, 1.5 V, is supplied from the controller 3a to the transistor N6, the transistor N6 is turned on and the anode terminal and the cathode terminal of the ferroelectric device C4 are shorted, thereby preventing a generation of a potential difference between the anode terminal and the cathode terminal of the ferroelectric device C4, and further, preventing any unexpected data from being written into the ferroelectric device C4.

The transmission control part DS2 may include a transistor N7 as a third transmission control circuit and a transistor N8 as a fourth transmission control circuit.

The transistor N7 may be an NMOS transistor. A source terminal S which is one end of the transistor N7 may be connected to the drain terminal D of the transistor N1 through the node Nd1 and the node Nd3. A gate terminal G which is a control terminal of the transistor N7 is connected to the controller 3a through the inverter INV2 to receive a signal that is inverted from the control signal SDS2 is inverted. The transistor N7 may be turned on or off by the control signal SDS2 from the controller 3a. By doing so, the transistor N7 may control the transmission of the storage data KD1 from the ferroelectric device C1 to the sense amplifier SA which is at a next stage. When the control signal SDS2 is inverted by the inverter INV2 from the low level to a high level at, for example, 1.5 V, and then input to the gate terminal G of the transistor N7, the transistor N7 may be turned on and transmit the storage data KD1 to the sense amplifier SA which is at the next stage. When the control signal SDS2 is inverted by the inverter INV2 from a high level at, for example, 1.5 V, to the low level and then input to the gate terminal G of the transistor N7, the transistor N7 may be turned off and stops the output of the storage data KD1 to the sense amplifier SA of the next stage.

The transistor N8 may be an NMOS transistor. A source terminal S, which is one end of the transistor N8, may be connected to the drain terminal D of the transistor N2 through the node Nd2 and the node Nd4. A gate terminal G that is a control terminal of the transistor N8 may be connected to the controller 3a through the inverter INV3 to receive a signal that is inverted from the control signal SDS3. The transistor N8 may be turned on or off by the control of the control signal SDS3 from the controller 3a. By doing so, the transistor N8 may control transmission of the storage data KD2 from the ferroelectric device C3 to the sense amplifier SA of the next stage. When the control signal SDS2 is inverted by the inverter INV3 from the low level to a high level at, for example, 1.5 V, and then input to the gate terminal G of the transistor N8, the transistor N8 may be turned on and transmit the storage data KD2 to the next stage. When the control signal STS2 is inverted by the inverter INV3 from a high level at, for example, 1.5 V, to the low level and then input to the gate terminal G of the transistor N8, the transistor N8 may be turned off and stop output of the storage data KD2 to the next stage.

The test voltage supply control part TS may include a transistor N9 as a first test voltage supply control circuit, and a transistor N10 as a second test voltage supply control circuit.

The transistor N9 may be an NMOS transistor. A source terminal S that is one end of the transistor N9 may be connected to the controller 3a to receive a control signal STS1 as a first test voltage therefrom. A gate terminal G which is a control terminal of the transistor N9 may be connected to the controller 3a to receive the control signal SDS2 from the controller 3a. A drain terminal D which is the other end of the transistor N9 may be connected to the drain terminal D which is the other end of the transistor N7, at the node Nd5 which is a third node. The transistor N9 may be turned on or off by the control signal SDS2 to perform to the control of supplying the control signal STS1 with a predetermined voltage level to the node Nd5. When the control signal SDS2 has a high level at, for example, 1.5 V, the transistor N9 may be turned on to transmit the control signal STS1 to the node Nd5. When the control signal SDS2 has the low level, the transistor N9 may be turned off and interrupt transmission of the control signal STS1 to the node Nd5. A potential of the node Nd5 will be referred to as a first potential, and the first potential may be determined by the storage data KD1 or the control signal STS1.

The transistor N10 may have an NMOS transistor. One end of the transistor N10 is a source terminal S, which may be connected to the controller 3a to receive the control signal STS2 as a second test voltage from the controller 3a. A control terminal of the transistor N10 is a gate terminal G which may be connected to the controller 3a to receive the control signal SDS3 from the controller 3a. The other end of the transistor N10 is a drain terminal D which may be connected to the drain terminal D that is the other end of the transistor N8 at the node Nd6 which is a fourth node. The transistor N10 may be turned on or off by the control signal SDS2 to perform controlling to supply the control signal STS2 having a predetermined voltage level to the node Nd6. When the control signal SDS3 has a high level at, for example, 1.5 V, the transistor N10 may be turned on and transmit the control signal STS2 to the node Nd6. When the control signal SDS3 has the low level, the transistor N10 may be turned off and stop the transmission of the control signal STS2 to the node Nd6. Also, a potential at the node Nd6 will be referred to as a second potential, and the second potential may be determined by the storage data KD2 or the control signal STS2.

The sense amplifier SA may include an input terminal SAin1, which may be connected to the drain terminal D of the transistor N7 through the node Nd5, an input terminal SAin2 which may be connected to the drain terminal D of the transistor N8 through the node Nd6. The sense amplifier may further include an output terminal SAout1 which may be connected to the second input terminal of the logic circuit NAND2, and an output terminal SAout2 which may be connected to the second input terminal of the logic circuit NAND1.

When the transistor N7 is turned on, the storage data KD1 stored in the ferroelectric device C1 may be input as a first potential to the input terminal SAin1 of the sense amplifier SA through the transistor N7 and the node Nd3. When the transistor N7 is turned off and the transistor N9 is turned on, the control signal STS1 may be input as a first potential to the input terminal SAin1 of the sense amplifier SA through the transistor N9 and the node Nd5. Further, when the transistor N8 is turned on, the storage data KD2 stored in the ferroelectric device C2 may be input as a second potential to the input terminal SAin2 of the sense amplifier SA through the transistor N8 and the node Nd4. When the transistor N8 is turned off and the transistor N10 is turned on, the control signal STS2 may be input as a second potential to the input terminal SAin2 of the sense amplifier SA through the transistor N10 and the node Nd5.

Based on a comparison between the first potential input to the input terminal SAin1 and second potential input to the input terminal SAin2, the sense amplifier SA may amplify the first potential and output an output signal SSAout1 from the output terminal SAout1, and may amplify the second potential and output an output signal SSAout2 from the output terminal SAout2. When the first potential is greater than the second potential, the sense amplifier SA may supply the output signal SSAout1 having a high level at, for example, 1.5 V, from the output terminal SAout1 to the second input terminal of the logic circuit NAND2, and supply the output signal SSAout2 having the low level from the output terminal SAout2 to the second input terminal of the logic circuit NAND1. When the first potential is smaller than the second potential, the sense amplifier SA may supply the output signal SSAout1 having the low level from the output terminal SAout1 to the second input terminal of the logic circuit NAND2, and supply the output signal SSAout2 having a high level at, for example, 1.5 V, from the output terminal SAout2 to the second input terminal of the logic circuit NAND1.

In addition, the sense amplifier SA may receive the control signal SSA from the controller 3a, so that driving of the sense amplifier SA is controlled. When the control signal SSA has a high level at, for example, 1.5 V, the sense amplifier SA may be driven. When the control signal SSA has the low level, the driving of the sense amplifier SA may be stopped and the output signal SSAout1 having a high level may be output from the output terminal SAout1 and the output signal SSAout2 having a high level may be output from the output terminal SAout2.

Here, the source terminal S of the transistor N7 may be connected to the node Nd1 and the drain terminal D thereof may be connected to the logic circuit NAND2 through the sense amplifier SA. That is, the ferroelectric device part K1 may be connected to the logic circuit NAND2 through the sense amplifier SA and the transistor N7. In other words, the transistor N7 may be provided at the first node which is a connection point between the ferroelectric device part K1 and the logic circuit NAND2. The transistor N7 may control transmission of the storage data KD1 from the ferroelectric device part K1 to the logic circuit NAND2.

The source terminal S of the transistor N8 may be connected to the node Nd2. The drain terminal D of the transistor N8 may be connected to the logic circuit NAND1 through the sense amplifier SA. That is, the ferroelectric device part K2 may be connected to the logic circuit NAND1 through the sense amplifier SA and the transistor N8. In other words, the transistor N8 may be provided at the second node which is a connection point between the ferroelectric device part K2 and the logic circuit NAND1. The transistor N8 may control transmission of the storage data KD2 from the ferroelectric device part K2 to the logic circuit NAND1.

The source terminal S of the transistor N9 may be connected to the controller 3a. Further, the drain terminal D of the transistor N9 may be connected to the node Nd5, namely, the node Nd5 which is a connection point between the transistor N7 and the logic circuit NAND2 through the sense amplifier SA. The transistor N9 may perform controlling the supply of the control signal STS1 to the logic circuit NAND2 through the sense amplifier SA.

The source terminal S of the transistor N10 may be connected to the controller 3a. Further, the drain terminal D of the transistor N10 may be connected to the node Nd6, namely, the node Nd6 which is a connection point between the transistor N8 and the logic circuit NAND1 through the sense amplifier SA. The transistor N10 may perform controlling the supply of the control signal STS2 to the logic circuit NAND1 through the sense amplifier SA.

Figure 2:
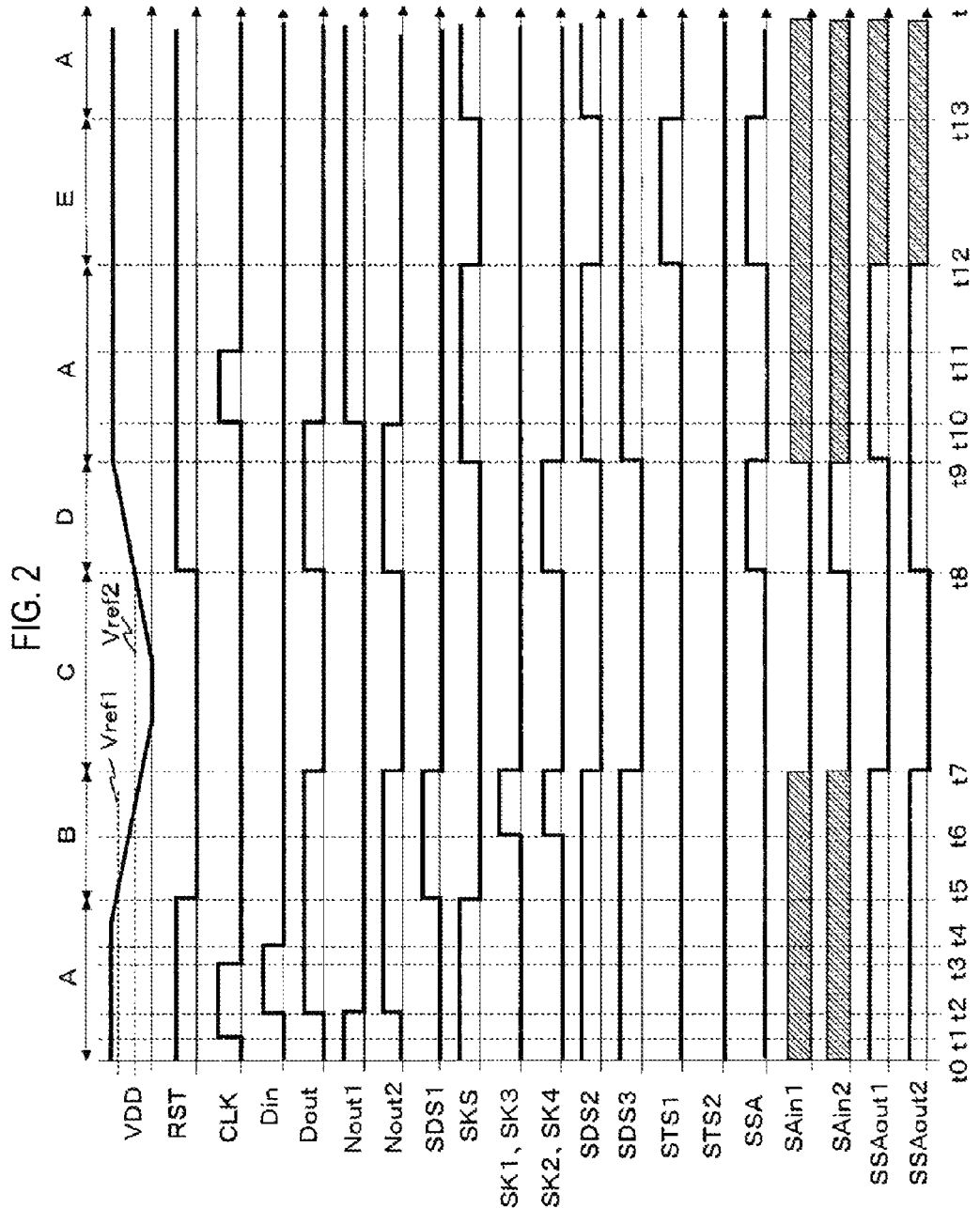
FIG. 2 is a timing chart illustrating operation examples of a series of signal waveforms of the electronic device 10.

FIG. 2 is a timing chart illustrating operation examples of a series of signal waveforms of the electronic device 10 illustrated in FIG. 1. The electronic device 10 may perform a normal operation during periods A between a time t0 and a time t5 between a time t9 and a time t2, and after a time t13. The electronic device 10 may perform a data writing operation during a period B between a time t5 and a time t7. The electronic device 10 may be in a state in which the source voltage VDD does not reach an operating voltage of the data retention control circuit 3 during a period C between time t7 to a time t8. The electronic device 10 may perform a data reading operation during a period D between a time t8 and t9. The electronic device 10 may perform an operation of testing characteristics of the ferroelectric storage part during a period E between a time t12 and a time t13. In FIG. 2, the times t0 to t13 are commonly applicable for all the signal waveforms. Also, it is assumed that each signal maintains its waveform at a previous time up to an immediately next time unless otherwise described. Further, the shaded portions indicate that a signal has a negative or flexible logic level.

During the period from time t0 to time t5, the electronic device 10 may perform a normal operation. The normal operation may refer to an operation of retaining in the data retention part M the data signal Din transmitted from an outside, and outputting the output signal Dout.

At the time t0, the source voltage VDD may be the rated voltage, 10 V. The reset signal RST may have a high level and the clock signal may have the low level. Further, the low level data signal Din may be input to the input terminal Tin1 and retained in the data retention part M, so that the low level output signal Dout may be output from the output terminal Tout. Since the data signal Din with the low level is retained in the data retention part M, the logic signal Nout1 has a high level and the logic signal Nout2 has a low level. When the control signal SDS1 has a low level, the transistor N1 and the transistor N2 may be turned off. When the control signal SKS has a high level, the transistors N3 to N6 may be turned on. When the control signals SK1 to SK4 have a low level, data writing into the ferroelectric devices C1 to C4 may be stopped. When the control signal SDS2 and the control signal SDS3 have a high level, the transistor N7 and the transistor N8 may be turned off, and thus, both potentials of the input terminal SAin1 and the input terminal SAin2 of the sense amplifier SA may be negative. Both the control signal STS1 and the control signal STS2 may have the low level. When the control signal SSA has the low level, the sense amplifier SA may be stopped from driving, and both the output signal SSAout1 and the output signal SSAout2 may have a high level.

At the time t1, when the clock signal CLK is supplied to the data retention control circuit 3 through the input terminal Tclk and input to the gate terminal G of the transistor Nc1, the transistor Nc1 may be turned on. Accordingly, the data signal Din may be input to the logic circuit NAND1.

At a time t2, the data signal Din may be changed to have a high level and input to the logic circuit NAND1. Accordingly, the logic signal Nout1 may be changed to have the low level and the output signal Dout may be changed to a high level. That is, the output signal Dout which had the low level before the time t2, may transit to a high level, and thus, the data retention circuit 3b may newly retain the logic level of the data signal Din. Also, at this time, the logic signal Nout2 may have a high level.

At a time t3, the supply of the clock signal CLK from the controller 3a is stopped, and thus, the transistor Nc1 may be turned off. At this time, since the data signal Din is retained at the high level, the data retention part M may stop updating the retained logic level of the data signal Din while retaining the output signal Dout at the high level. Further, the updating of the retained data in the data retention part M may refer to retaining a logic level of the latest data signal Din in the data retention part M. The stop of updating of the retained data may refer to last retaining the data signal Din in the data retention part M immediately before the transistor Nc1 was turned off, without any further retainment of a new data signal Din thereafter.

At a time t4, the data signal Din may have the low level. At this time, since the transistor Nc1 was already turned off at the time t3, the data retention part M may retain the output signal Dout with the high level state regardless of transition of the data signal Din.

During the period between the time t5 and the time t7, the electronic device 10 may perform a data writing operation. The data writing operation may be an operation of storing data in the ferroelectric storage part K based on the data signal Din retained in the data retention part M. That is, the logic level of the logic signal Nout1 may be stored as the storage data KD1 in the ferroelectric device part K1, and the logic level of the logic signal Nout2 may be stored as the storage data KD2 in the ferroelectric device part K2.

At the time t5, when detecting that the power source 1 is stopped from driving, and the source voltage VDD is lowered to be smaller than a threshold voltage Vref1, the reset circuit 2 transmits the reset signal RST with the low level to the input terminal Tin3 of the data retention control circuit 3.

When receiving the reset signal RST with the low level, the controller 3a may, in a logic signal transmission step, set the control signal SDS1 to have a high level to turn on the transistor N1 and the transistor N2, thereby transmitting the logic signal Nout1 from the logic circuit NAND1 to the ferroelectric device part K1, and transmitting the logic signal Nout2 from the logic circuit NAND2 to the ferroelectric device part K2. In addition, the controller 3a may set the control signal SKS to have the low level to turn off the transistors N3 to N6. Accordingly, the logic signal Nout1 with the high level may be applied to the anode terminal of the ferroelectric device C1 and the cathode terminal of the ferroelectric device C2 through the transistor N1 via the node Nd1. Also, the logic signal Nout2 with the low level may be applied to the anode terminal of the ferroelectric device C3 and the cathode terminal of the ferroelectric device C4 through the transistor N2 via the node Nd2. At this time, the control signal SDS2 and the control signal SDS3 may have the high level, so that the transistor N7 and the transistor N8 may be turned off. This may cause that the input terminal SAin1 of the sense amplifier SA may be insulated from the ferroelectric device part K1 and the input terminal SAin2 may be insulated from the ferroelectric device part K2. Therefore, data may be stored in the ferroelectric device part K1 and the ferroelectric device part K2, individually, without being affected by capacitances of the input terminals of the sense amplifier SA.

In a storage control step, all the control signals SK1 to SK4 may have the low level. Thus, the residual polarization state of the ferroelectric device C1 in which the control signal SK1 with the low level is applied to the cathode terminal thereof may be the non-reverse state where the ferroelectric device C1 maintains a predetermined capacitance value. The residual polarization state of the ferroelectric device C2 in which the low level control signal SK2 is applied to the anode terminal thereof may be the reverse state where the ferroelectric device C2 does not maintain a smaller capacitance value than that of the ferroelectric device C1. This causes that the logic level, i.e., the high level, of the logic signal Nout1 is recorded as the storage data KD1 in the ferroelectric device K1. Also, at this time, since the logic levels, i.e., potentials, of the signals applied to the anode and cathode terminals of the ferroelectric device C3 and the ferroelectric device C4 are all the same, the residual polarization states are not changed. Thus, no data is recorded in the ferroelectric device part K2.

At a time t6, when the logic signal Nout1 with the high level is applied to the anode terminal of the ferroelectric device C1 and the cathode terminal of the ferroelectric device C2 through the node Nd1 and when the logic signal Nout2 with the low level is applied to the anode terminal of the ferroelectric device C3 and the cathode terminal of the ferroelectric device C4 through the node Nd2, all the control signals SK1 to SK4 may be changed to have the high level in the storage control step. Thus, the residual polarization state of the ferroelectric device C3 in which the control signal SK3 with the high level may be applied to the cathode terminal thereof may be the reverse state. Also, the residual polarization state of the ferroelectric device C4 in which the control signal SK4 with the high level may be applied to the anode terminal thereof may be the non-reverse state. This may cause that the logic level of the logic signal Nout2, i.e., the low level, may be recorded as the storage data KD2 in the ferroelectric device part K2. Also, at this time, since the logic levels, i.e., potentials, of the signals applied to both ends of the ferroelectric device C1 and the ferroelectric device C2 are all the same, all the residual polarization states may not be changed. Therefore, the ferroelectric device part K1 may retain the logic level of the storage data KD1 stored during a period between the time t5 and the time t6.

At a time t7, when the source voltage VDD is dropped to below a voltage at which each circuit of the data retention control circuit 3 can be driven, the transistor N1, the transistor N2, the transistor N7, and the transistor N8 may be all turned off. The source voltage VDD becomes 0 V, thereafter. At this time, since the ferroelectric devices C1 to C4 are non-volatile memory devices, the ferroelectric device part K1 may retain the storage data KD1 with the high level, and the ferroelectric device part K2 may retain the storage data KD2 with the low level.

During the period between the time t8 and the time t9, the electronic device 10 may perform a data reading operation. The data reading operation may be an operation of reading data stored in the ferroelectric storage part K and returning the read data to the data retention part M. The storage data KD1 retained in the ferroelectric device part K1 may be returned to the logic signal Nout1, and the storage data KD2 retained in the ferroelectric device part K2 may be returned to the logic signal Nout2, thereby returning the output signal Dout to the state before the driving of the power source 1 was stopped.

At the time t8, when detecting that the power source 1 starts and the source voltage VDD is again greater than the threshold voltage Vref2, the reset circuit 2 may transmit the high level reset signal RST to the input terminal Tin3 of the data retention control circuit 3.

When receiving the reset signal RST with the high level, the controller 3a may, in a logic signal transmission interruption step, turn off the transistor N1 and the transistor N2 by the control signal SDS1 with the low level to interrupt transmission of the logic signal Nout1 from the logic circuit NAND1 to the ferroelectric device part K1, and interrupt transmission of the logic signal Nout2 from the logic circuit NAND2 to the ferroelectric device part K2. In addition, the controller 3a turns off the transistors N3 to N6 depending on the control signal SKS having the low level.

Further, in a storage data transmission step, the controller 3a may set the control signals SDS2 and SDS3 to have the low level to turn on the transistor N7 and the transistor N8, and set the control signals SK2 and SK4 to have the high level and the control signals SK1 and SK3 to have the low level. Also, the controller 3a may output the control signal SSA having the high level to the sense amplifier SA. In this manner, the storage data KD1 with the high level which is stored in the ferroelectric device part K1 may be input to the input terminal SAin1 of the sense amplifier SA, and the storage data KD2 with the high level which is stored in the ferroelectric device part K2 may be input to the input terminal SAin2 of the sense amplifier SA.

When the storage data KD1 with the high level is input to the input terminal SAin1 of the sense amplifier SA and the storage data KD2 with the high level is input to the input terminal SAin2 of the sense amplifier SA, the sense amplifier SA may compare the storage data KD1 and the storage data KD2. In this embodiment, since the storage data KD1 is smaller than the storage data KD2, the output signal SSAout1 with the low level may be output from the output terminal SAout1 and supplied to the logic circuit NAND2, and the output signal SSAout2 with the high level may be output from the output terminal SAout2 and supplied to the logic circuit NAND1. Accordingly, the storage data KD1 retained in the ferroelectric device part K1 may be returned to the logic signal Nout1, and the storage data KD2 retained in the ferroelectric device part K2 may be returned to the logic signal Nout2, thereby returning the output signal Dout to the state before the driving of the power source 1 was stopped.

During the period between the time t9 and the time t12, the electronic device 10 may again operate normally.

At the time t9, the source voltage VDD may be the rated voltage, 10 V. At this time, since the logic signal Nout1 becomes to have the low level and the logic signal Nout2 becomes to have the high level through the data reading operation, the output signal Dout with the high level may be output from the output terminal Tout. When the control signal SDS1 has the low level, the transistor N1 and the transistor N2 may be turned off. When the control signal SKS has the high level, the transistors N3 to N6 may be turned on. When the control signals SK1 to SK4 have the low level, writing of data into the ferroelectric devices C1 to C4 may be stopped. When the control signal SDS2 and the control signal SDS3 have the high level, the transistor N7 and the transistor N8 may be turned off. Both the control signal STS1 and the control signal STS2 may have the low level. When the control signal SSA has the low level, the sense amplifier SA may be stopped from its operation, and thus, all the output signals SSAout1 and SSAout2 may have the high level. Also, at the time t9, the data signal Din with low level may be input to the input terminal Tin.

At a time t10, when the clock signal CLK is supplied to the data retention control circuit 3 through the input terminal Tclk and input to the gate terminal G of the transistor Nc1, the transistor Nc1 may be turned on. Accordingly, the data signal Din may be input to the logic circuit NAND1. Thus, the logic signal Nout1 may have the high level and the output signal Dout may have the low level. That is, the output signal Dout which had the high level before the time t10 may transit to have the low level, and the data retention circuit 3b may newly retain the logic level of the data signal Din. Also, at this time, the logic signal Nout2 may have the low level.

At a time t11, the supply of the clock signal CLK from the controller 3a may be stopped, and thus, the transistor Nc1 may be turned off. At this time, since the data signal Din is retained at the low level, the data retention part M may maintain the output signal Dout at the low level while stopping update with the logic level of the data signal Din.

During the period between the time t12 and the time t13, the electronic device 10 may perform an operation of testing characteristics (hereinafter, referred to as a "characteristics testing operation") of the ferroelectric storage part K. The characteristics testing operation may be an operation of testing whether the ferroelectric device C1 and the ferroelectric device C2 provided in the ferroelectric device part K1 of the ferroelectric storage part K can retain the logic signal Nout1 at a desired logic level, and whether the ferroelectric device C3 and the ferroelectric device C4 provided in the ferroelectric device part K2 can retain the logic signal Nout2 at a desired logic level. In this embodiment, the operation of testing whether the ferroelectric device part K1 can retain the logic signal Nout1 at a desired logic level will be described. This may be similarly applicable for the operation of testing whether the ferroelectric device part K2 can retain the logic signal Nout2 at a desired logic level.

At the time t12, in the logic signal interruption step, when the control signal SDS1 has the low level, the transistor N1 and the transistor N2 may be turned off, thereby interrupting transmission of the logic signal Nout1 from the logic circuit NAND1 to the ferroelectric device part K1, and transmission of the logic signal Nout2 from the logic circuit NAND2 to the ferroelectric device part K2. The control signal SKS may be changed to have the low level, and the transistors N3 to N6 may be turned off.

In addition, in the step of testing ferroelectric storage part, when the control signal SDS2 has the low level, the transistor N9 may be turned off and the transistor N7 may be turned on, so that the storage data KD1 may be input to the input terminal SAin1 of the sense amplifier SA. Also, in the step of testing the ferroelectric storage part, when the control signal SDS3 has the high level, the transistor N8 may be turned off, so that the input of the storage data KD2 to the input terminal SAin2 of the sense amplifier SA may be interrupted and the transistor N10 may be turned on. Thus, the storage data KD1 may be transmitted from the ferroelectric device part K1 to the input terminal SAin1 of the sense amplifier SA, and the control signal STS2 having a predetermined voltage level may be transmitted to the input terminal SAin2 of the sense amplifier SA. In this embodiment, for example, the control signal STS2 may be set to, for example, 2.5 V, as a middle level between the low level and the high level.

When the storage data KD1 is input to the input terminal SAin1 of the sense amplifier SA and the control signal STS2 is input to the input terminal SAin2 of the sense amplifier SA, the sense amplifier SA may compare the storage data KD1 and the control signal STS2.

In a characteristics determining step, when the characteristics of the ferroelectric device part K1 is normal, the storage data KD1 with the low level is smaller than the control signal STS2 with the middle level, and thus, the output signal SSAout1 with the low level may be output from the output terminal SAout1 and supplied to the logic circuit NAND2, and the output signal SSAout2 with the high level may be output from the output terminal SAout2 and supplied to the logic circuit NAND1. At this time, since the logic signal Nout1 has the low level, the output signal Dout may have the high level. The output signal Dout may be detected by, for example, a testing device or the like which may be connected to the output terminal Tout. It may be determined that the storage characteristics of the ferroelectric device part K1 are normal, and the testing operation may be terminated.

Further, in the characteristics determining step, when the characteristics of the ferroelectric device part K1 are abnormal, the storage data KD1 with the low level may be greater than the control signal STS2 with the middle level, and thus, the output signal SSAout1 with the high level may be output from the output terminal SAout1 and supplied to the logic circuit NAND2, and the output signal SSAout2 with the low level may be output from the output terminal SAout2 and supplied to the logic circuit NAND1. At this time, since the logic signal Nout1 has the high level, the output signal Dout may have the low level. The output signal Dout may be detected by, for example, a testing device or the like which may be connected to the output terminal Tout. It may be determined that the storage characteristics of the ferroelectric device part K1 are abnormal, and the testing operation may be terminated.

In addition, the control signal STS2 as a test voltage is not limited to 2.5 V but may be changed stepwise so that a level of degradation of the storage characteristics of the ferroelectric device part K1 may be detected.

Also, although this embodiment describes the characteristics test of the ferroelectric device part K1, the data retention control circuit 3 of the present disclosure may also test the characteristics of the ferroelectric device part K2. In this case, compared with the characteristics test of the ferroelectric device part K1, the transistor N7 may be turned off and the transistor N8 may be turned on by setting the control signal SDS2 to have the high level, and the transistor N9 may be turned on and the transistor N10 may be turned off by setting the control signal SDS3 to have the low level. Then, the sense amplifier SA may output a comparison result between the control signal STS1 and the storage data KD2 so that the output signal Dout may be detected.

After the time t13, the electronic device 10 may operates normally again. At this time, the control signal SKS may be changed to have the high level so that the transistor N1 and the transistor N2 may be turned off. Also, the control signal SDS2 may be changed to have the high level so that the transistor N7 may be turned off, and the control signal SDS3 may have the high level so that the transistor N8 may be turned off. Further, the control signal SSA may be changed to have the low level so that the operation of the sense amplifier SA may be stopped.

As described above, in the electronic device 10 in accordance with the first embodiment of the present disclosure, when the characteristics test of the ferroelectric device part K is performed, the control signal STS1 may be supplied to the node Nd5 between the ferroelectric device part K1 and the input terminal SAin1 of the sense amplifier SA, or the control signal STS2 may be supplied to the node Nd6 between the ferroelectric device part K2 and the input terminal SAin2 of the sense amplifier SA. Therefore, a problem where the ferroelectric device part K1 and the ferroelectric device part K2 are changed during the characteristics test can be solved. Further, the characteristics test of the ferroelectric device part K1 and the ferroelectric device part K2 can be more precisely performed.

Modifications of First Embodiment

Figure 3:
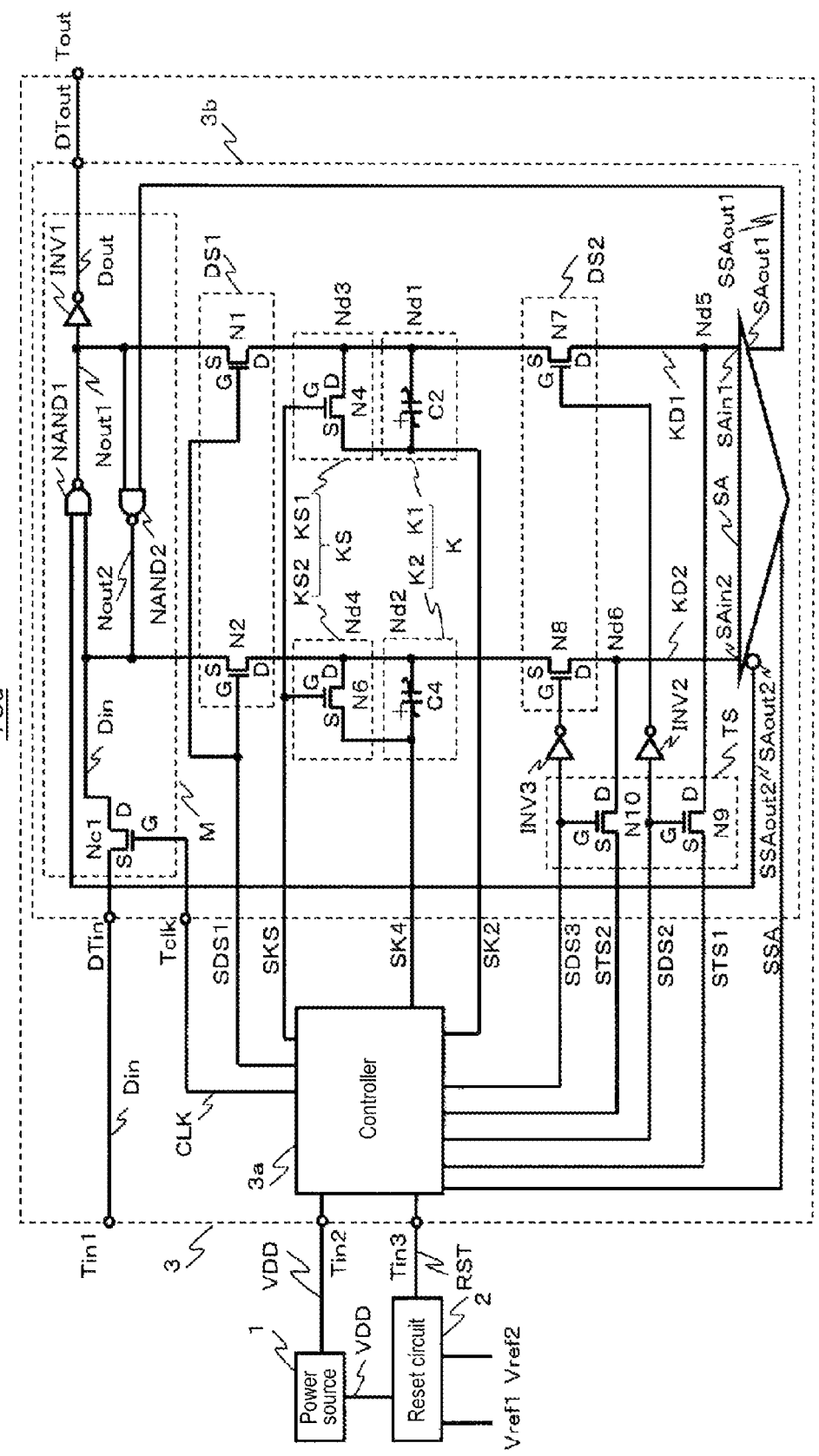
FIG. 3 illustrates an electronic device 10a which is a modified embodiment of the first embodiment of the present disclosure.

FIG. 3 is a view illustrating an electronic device 10a according to a modification of the first embodiment of the present disclosure. The electronic device 10a may include a power source 1, a reset circuit 2, and a data retention control circuit 3. The data retention control circuit 3 may include a ferroelectric storage part K. The ferroelectric storage part K may include a ferroelectric device part K1, which may include a ferroelectric device C2, and a ferroelectric device part K2, which may include a ferroelectric device C4. As such, the electronic device 10a may be different from the electronic device 10, in that the ferroelectric device part K1 of the ferroelectric storage part K may not have a ferroelectric device C1, the ferroelectric device part K2 may not have a ferroelectric device C3, a storage control part KS1 of a storage control part KS may not have a transistor N3, and a storage control part KS2 may not have a transistor N5. Also, the same reference numerals will be used for the same components of the electronic device 10a as those of the electronic device 10 illustrated in FIG. 1 and thus the description thereof will be omitted.

Storage data KD1, which may be stored in and output from the ferroelectric device part K1, may be determined by data stored in the ferroelectric device C2. In this modification, when the logic signal Nout1 has the high level in the data retention circuit 3b, the high level may be applied to a cathode terminal of the ferroelectric device C2. Also, with the supply of the control signal SK2 having the low level, the residual polarization state may be the non-reverse state, and thus, a capacitance value of the ferroelectric device C2 may become to almost zero. Then, the storage data KD1 may be changed to have the high level. Further, when the logic signal Nout1 has the low level, the low level signal may be applied to the cathode terminal of the ferroelectric device C2. Under this state, when the control signal SK2 has the high level, the residual polarization state may be the reverse state, so that a predetermined capacitance may be accumulated in the ferroelectric device C2. Therefore, the storage data KD1 may be changed to have the low level.

Storage data KD2 which may be stored in and output from the ferroelectric device part K2 may be determined by data stored in the ferroelectric device C4. In the data retention circuit 3b according to the embodiment, when the logic signal Nout2 has the high level, the high level signal is applied to a cathode terminal of the ferroelectric device C4. Under this state, when the control signal SK4 has the low level, the residual polarization state may be the non-reverse state, so that a capacitance value of the ferroelectric device C4 may become almost zero. Then, the storage data KD2 may be changed to have the high level. Further, when the logic signal Nout2 has the low level, the low level signal may be applied to the cathode terminal of the ferroelectric device C4. Under this state, when the control signal SK4 has the high level, the residual polarization state may be the reverse state, so that a predetermined capacitance may be accumulated in the ferroelectric device C4. Then, the storage data KD2 may be changed to have the low level.

Second Embodiment

Figure 4:
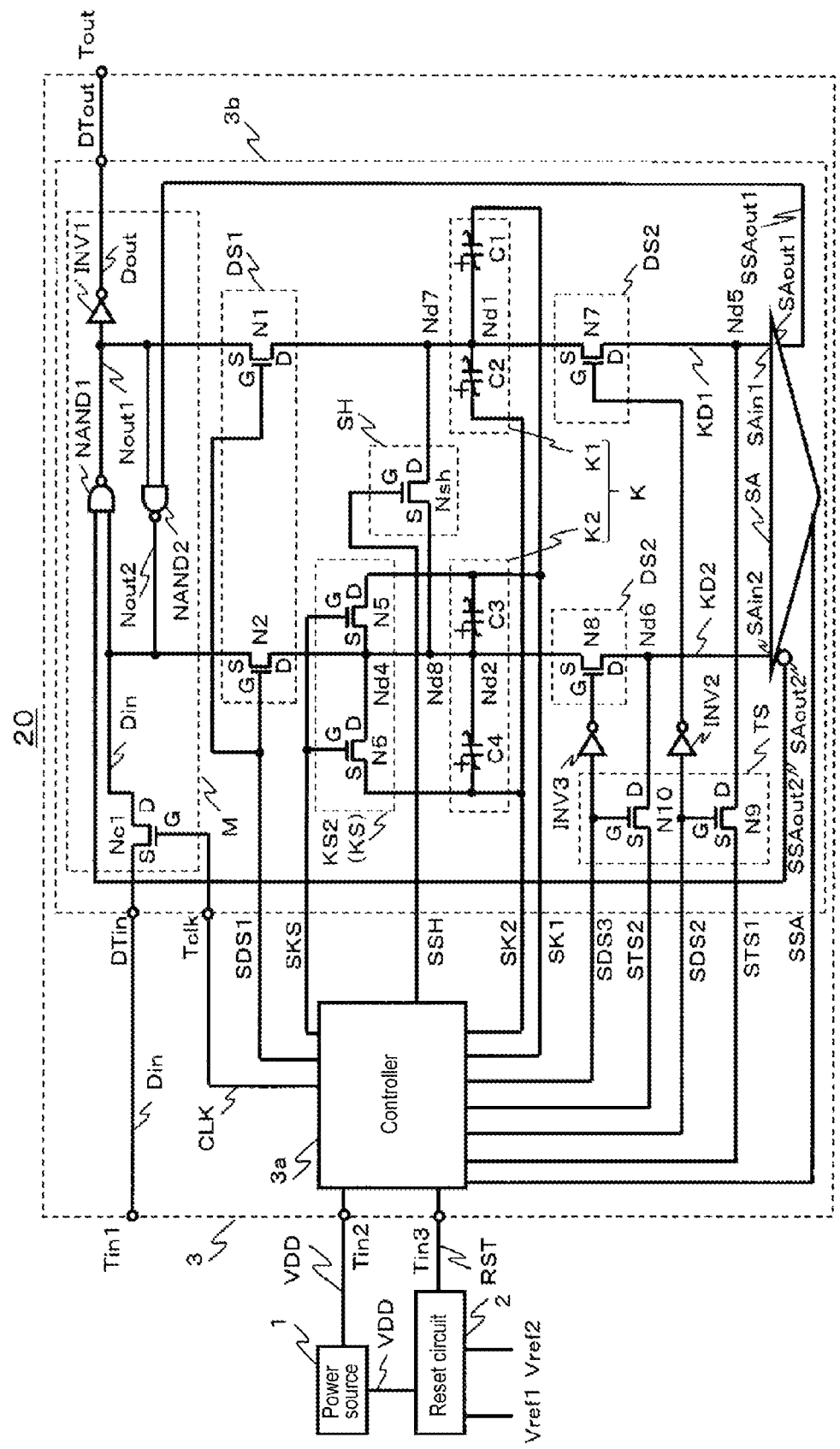
FIG. 4 illustrates an electronic device 20 according to a second embodiment of the present disclosure.
Figure 5:
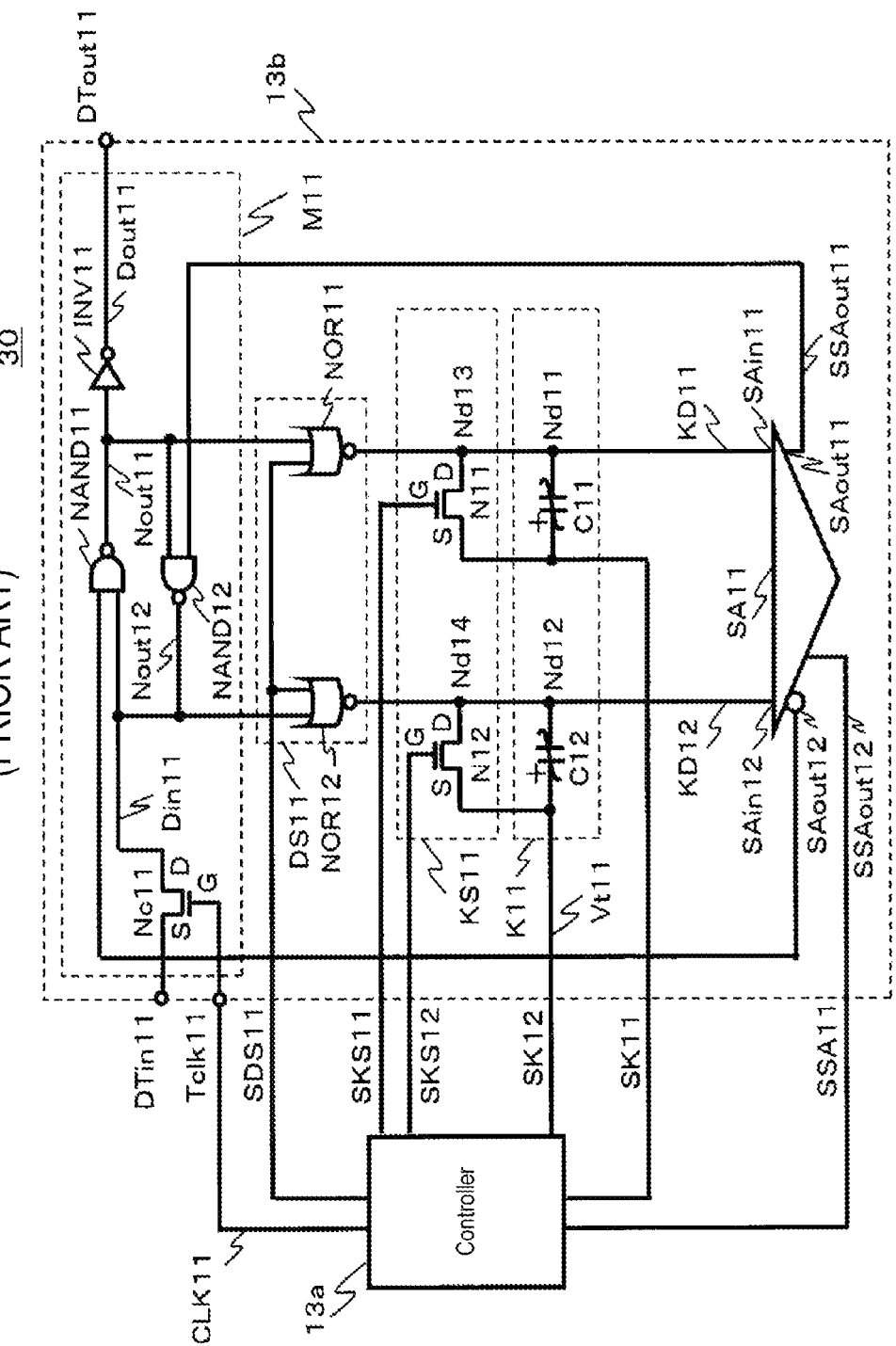
FIG. 5 is a view schematically illustrating the conventional data retention control circuit 30.

FIG. 4 is a view illustrating an electronic device 20 in accordance with a second embodiment of the present disclosure. The electronic device 20 may include a power source 1, a reset circuit 2, and a data retention control circuit 3. A storage control part KS of the data retention control circuit 3 may have a storage control part KS2. In addition, the data retention control circuit 3 may have a transistor Nsh as a short control part SH. The electronic device 20 may be different from the electronic device 10 in that the storage control part KS may not have a storage control part KS1 but have the transistor Nsh. Also, the same reference numerals will be used for the same components of the electronic device 20 as those of the electronic device 10 illustrated in FIG. 1 and the descriptions thereof will be omitted.

A source terminal S as one end of the transistor Nsh may be connected to a node Nd7 which is a connection point between a node Nd4 and a node Nd2. A drain terminal D as the other end thereof may be connected to a node Nd8 which is a connection point between a node Nd1 and a drain terminal D of the transistor N1. Further, a gate terminal G as a control terminal of the transistor Nsh may be connected to the controller 3a to receive a control signal SSH from the controller 3a.

During a period A during which the electronic device 20 operates normally, the transistor Nsh may be turned on upon receipt of a control signal SSH having the high level, thereby shorting the node Nd8 and the node Nd7, which is locate closer to the drain terminal D of the transistor N1 than an anode terminal of the ferroelectric device C1 and a cathode terminal of the ferroelectric device C2 are. Thus, even in a case in which the transistor N3 and the transistor N4 of the storage control part KS1 are not provided like the electronic device 10, during the normal operation, the anode terminal and the cathode terminal of the ferroelectric device C1 can be short-circuited, the anode terminal and the cathode terminal of the ferroelectric device C2 can be short-circuited. Accordingly, the circuit area of the electronic device 10 can be reduced.

Also, transistors used in the electronic devices 10, 10a, and 20 according to the present disclosure may be an NMOS transistor or a PMOS transistor. The PMOS transistor may be used instead of the NMOS transistor and the NMOS transistor may be used instead of the PMOS transistor. Also, a pass switch may be used instead of the NMOS transistor or the PMOS transistor.

Further, in the electronic devices 10, 10a, and 20 according to the present disclosure, the data writing operation and the data reading operation are performed based on a transition of the reset signal RST following a change of the source voltage VDD. However, the data writing operation and the data reading operation are not limited thereto and may be performed by the controller 3a based on any other signals, or may be periodically performed at a time determined in advance by the controller 3a.

Moreover, in the electronic devices 10, 10a, and 20 according to the present disclosure, the source voltage VDD may have 10 V as an example. However, the present disclosure is not limited thereto and the source voltage may be the voltage, for example, 1.5 V, which may be the same as the operating voltages of the transistors, the control signals, and the sense amplifier SA.

Further, in the electronic devices 10, 10a, and 20 according to the present disclosure, it is described as an example that the output signal SSAout1 as an output of the storage data KD1 is input to the second input terminal of the logic circuit NAND2 and the output signal SSAout2 as an output of the storage data KD2 is input to the second input terminal of the logic circuit NAND1 has been illustrated. However, the present disclosure is not limited thereto. That is, the data retention circuit 3b may store the data, which is retained in the data retention part M, in the ferroelectric storage part K, and then output the storage data KD1 and the storage data KD2 to a circuit different from the data retention part M, namely, such that the storage data can be read. Also, in this case, only one of the storage data KD1 and the storage data KD2 may be read and used.

Furthermore, in the electronic devices 10, 10a, and 20 according to the present disclosure, although it is described as for the data retention part M including the logic circuit NAND1 and the logic circuit NAND2, that the output signal Nout1 from the logic circuit NAND1 is stored in the ferroelectric device part K1 and the output signal Nout2 from the logic circuit NAND2 is stored in the ferroelectric device part K2, the present disclosure is not limited thereto. That is, instead of the data retention part M, a third logic circuit connected to the ferroelectric device part K1 through the transistor N1 and a fourth logic circuit independently installed from the third logic circuit and connected to the ferroelectric device part K2 through the transistor N2 may be provided. Further, the ferroelectric device part K1 may store a logic level output from the third logic circuit and the ferroelectric device part K2 may store a logic level output from the fourth logic circuit. Also, the storage data KD1 that can be obtained from a logic level of the third logic circuit may be output to a circuit different from the third logic circuit, and the storage data KD2 that can be obtained from a logic level of the fourth logic circuit may be output to a circuit different from the fourth logic circuit.

According to the present disclosure in some embodiments, it is possible to provide a data retention control circuit using a ferroelectric device, a data writing method using the data retention control circuit, a data reading method, a method of testing characteristics of a ferroelectric storage part, and a semiconductor chip, which are capable of testing characteristics of a ferroelectric device more precisely.

The data retention control circuit, the data writing method, the data reading method, the method of testing the characteristics of a ferroelectric storage device, and the semiconductor chip of the present disclosure can test the characteristics of a ferroelectric device with higher precision, thereby increasing its industrial applicability.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A data retention control circuit, comprising:
   a data retention part for retaining a logic level of a data signal to be output as an output signal, the data retention part having a first logic circuit for outputting a first logic signal based on the logic level of the data signal, and a second logic circuit for outputting a second logic signal, which is based on the first logic signal, to the first logic circuit;
   a ferroelectric storage part having a first ferroelectric device part for storing as first storage data a logic level of the first logic signal, which is output from the first logic circuit, and a second ferroelectric device part for storing as second storage data a logic level of the second logic signal, which is output from the second logic circuit;
   a first transmission control part having a first transmission control circuit for controlling transmission of the first logic signal, which is output from the first logic circuit, to the first ferroelectric device part, and a second transmission control circuit for controlling transmission of the second logic signal, which is output from the second logic circuit, to the second ferroelectric device part;
   a second transmission control part having a third transmission control circuit provided at a first node which is a connection point between the first ferroelectric device part and the second logic circuit, and a fourth transmission control circuit provided at a second node which is a connection point between the second ferroelectric device part and the first logic circuit, the third transmission control circuit controlling transmission of the first storage data, which is output from the first ferroelectric device part, to the second logic circuit, and the fourth transmission control circuit controlling transmission of the second storage data, which is output from the second ferroelectric device part, to the first logic circuit; and a test voltage supply control part having a first test voltage supply control circuit connected to a third node which is a connection point between the third transmission control circuit and the second logic circuit, and a second test voltage supply control circuit connected to a fourth node which is a connection point between the fourth transmission control circuit and the first logic circuit, the first test voltage supply control circuit controlling a supply of a first test voltage to the second logic circuit, and the second test voltage supply control circuit controlling a supply of a second test voltage to the first logic circuit.

2. The control circuit of claim 1, further comprising:
a controller which is driven by a source voltage supplied from a power source and controls the first transmission control part, the second transmission control part, and the test voltage supply control part.

3. The control circuit of claim 2, further comprising a sense amplifier,
wherein the sense amplifier includes:
a first input terminal to which a first potential of the third node is input;
a second input terminal to which a second potential of the fourth node is input;
a first output terminal for outputting a first comparison result signal to the second logic circuit, the first comparison result signal being generated by amplifying the first potential based on a comparison between the first potential and the second potential; and
a second output terminal for outputting a second comparison result signal to the first logic circuit, the second comparison result signal being generated by amplifying the second potential based on a comparison between the first potential and the second potential.

4. The control circuit of claim 2, wherein the first transmission control circuit includes one end connected to an output terminal of the first logic circuit, the other end connected to one end of the first ferroelectric device part, and a control terminal connected to the controller;
the other end of the first transmission control circuit is connected to the controller;
one end of the third transmission control circuit is connected to one end of the first ferroelectric device part, the other end of the third transmission control circuit is electrically connected to the first logic circuit, and a control terminal of the third transmission control circuit is electrically connected to the controller;
one end of the second transmission control circuit is connected to an output terminal of the second logic circuit, the other end of the second transmission control circuit is connected to one end of the second ferroelectric device part, and a control terminal of the second transmission control circuit is connected to the controller;
the other end of the second ferroelectric device part is connected to the controller; and
one end of the fourth transmission control circuit is connected to one end of the second ferroelectric device part, the other end of the fourth transmission control circuit is electrically connected to the second logic circuit, and a control terminal of the fourth transmission control circuit is electrically connected to the controller.

5. The control circuit of claim 4, wherein the first transmission control circuit is a first transistor, and one end of the first transistor is a source terminal, the other end of the first transistor is a drain terminal, and a control terminal of the first transistor is a gate terminal; and
the second transmission control circuit is a second transistor, and one end of the second transistor is a source terminal, the other end of the second transistor is a drain terminal, and a control terminal of the second transistor is a gate terminal.

6. The control circuit of claim 4, wherein the third transmission control circuit is a third transistor, and one end of the third transistor is a source terminal, the other end of the third transistor is a drain terminal, and a control terminal of the third transistor is a gate terminal; and
the fourth transmission control circuit is a fourth transistor, one end of the fourth transistor is a source terminal, the other end of the fourth transistor is a drain terminal, and a control terminal of the fourth transistor is a gate terminal.

7. The control circuit of claim 2, wherein, one end of the first test voltage supply control circuit is connected to the controller and the other end of the first test voltage supply control circuit is connected to the third node; and
one end of the second test voltage supply control circuit is connected to the controller and the other end of the second test voltage supply control circuit is connected to the fourth node.

8. A data retention control circuit, comprising:
a first logic circuit for outputting a first logic signal;
a second logic circuit for outputting a second logic signal;
a ferroelectric storage part having a first ferroelectric device part for storing as first storage data a logic level of the first logic signal, which is output from the first logic circuit, and a second ferroelectric device part for storing as second storage data a logic level of the second logic signal, which is output from the second logic circuit;
a first transmission control part having a first transmission control circuit for controlling transmission of the first logic signal, which is output from the first logic circuit, to the first ferroelectric device part, and a second transmission control circuit for controlling transmission of the second logic signal, which is output from the second logic circuit, to the second ferroelectric device part;
a second transmission control part having a third transmission control circuit provided at a first node which is a connection point between the first ferroelectric device part and a third logic circuit, and a fourth transmission control circuit provided at a second node which is a connection point between the second ferroelectric device part and a fourth logic circuit, the third transmission control circuit controlling transmission of the first storage data, which is output from the first ferroelectric device part, to the third logic circuit, and the fourth transmission control circuit controlling transmission of the second storage data, which is output from the second ferroelectric device part, to the fourth logic circuit; and
a test voltage supply control part including a first test voltage supply control circuit connected to a third node as a connection point between the third transmission control circuit and the third logic circuit, and a second test voltage supply control circuit connected to a fourth node as a connection point between the fourth transmission control circuit and the fourth logic circuit, the first test voltage supply control circuit controlling a supply of a first test voltage to the third logic circuit, and the second test voltage supply control circuit controlling a supply of a second test voltage to the fourth logic circuit.

9. A data writing method of storing the logic level of the data signal in the ferroelectric storage part of the data retention control circuit of claim 2, comprising:
   transmitting the first logic signal to the first ferroelectric device part and transmitting the second logic signal to the second ferroelectric device part, by using a first transmission control signal which is output from the controller to the first transmission control circuit and the second transmission control circuit; and
   storing the logic level of the first logic signal in the first ferroelectric device part by using a first storage control signal which is output from the controller to the first ferroelectric device part, and storing the logic level of the second logic signal in the second ferroelectric device part by using a second storage control signal which is output from the controller to the second ferroelectric device part.

10. The method of claim 9, wherein transmitting the first logic signal and storing the logic level are conducted when the controller receives a first reset signal which is generated if a reset circuit detects that the source voltage is equal to or smaller than a first reference voltage.

11. A data reading method of reading the first storage data and the second storage data from the ferroelectric storage part of the data retention control circuit of claim 2, comprising:
   interrupting transmission of the first logic signal to the first ferroelectric device part and interrupting transmission of the second logic signal to the second ferroelectric device part, by using a first transmission control signal which is output from the controller to the first transmission control circuit and the second transmission control circuit; and
   transmitting the first storage data to the first logic circuit by using a second transmission control signal which is output from the controller to the third transmission control circuit, and transmitting the second storage data to the second logic circuit by using a third transmission control signal which is output from the controller to the fourth transmission control circuit.

12. The method of claim 11, wherein interrupting transmission of the first logic signal and transmitting the first storage data are conducted when the controller receives a second reset signal which is generated if a reset circuit detects that the source voltage is equal to or greater than a second reference voltage.

13. A method of testing characteristics of the ferroelectric storage part of the data retention control circuit of claim 3, comprising:
   interrupting transmission of the first logic signal to the first ferroelectric device part and interrupting transmission of the second logic signal to the second ferroelectric device part, by using a first transmission control signal which is output from the controller to the first transmission control circuit and the second transmission control circuit;
   testing a ferroelectric storage part, including:
      interrupting transmission of the first storage data to the first input terminal and supplying the first test voltage to the first input terminal, by using a second transmission control signal which is output from the controller to the third transmission control circuit, and transmitting the second storage data to the second input terminal by using a third transmission control signal which is output from the controller to the fourth transmission control circuit; or
      transmitting the first storage data to the first input terminal by using a second transmission control signal which is output from the controller to the third transmission control circuit, and interrupting transmission of the second storage data to the second input terminal and supplying the second test voltage to the second input terminal by using a third transmission control signal which is output from the controller to the fourth transmission control circuit; and
   determining characteristics of the ferroelectric storage part based on a logic level of the output signal which is determined by the second comparison result signal.

14. A semiconductor chip, comprising:
   a retention control circuit of claim 2;
   a first electrode pad electrically connected to an input terminal of the first logic circuit, and configured to receive the data signal from the outside; and
   a second electrode pad configured to receive the source voltage supplied from the power source.

* * * * *